United States Patent [19]
Freund et al.

[11] Patent Number: 6,017,804
[45] Date of Patent: Jan. 25, 2000

[54] METHOD AND APPARATUS FOR CLEAVING SEMICONDUCTOR MATERIAL

[75] Inventors: Joseph Michael Freund, Fogelsville; George John Przybylek, Douglasville; Dennis Mark Romero, Allentown; John William Stayt, Jr., Schnecksville, all of Pa.

[73] Assignee: Lucent Technologies Inc., Murray Hill, N.J.

[21] Appl. No.: 09/004,939

[22] Filed: Jan. 9, 1998

[51] Int. Cl.[7] .................. H01L 21/301; H01L 21/46; H01L 21/78; H01L 21/00
[52] U.S. Cl. .................. 438/460; 438/464; 438/68; 438/114; 438/458
[58] Field of Search .................. 438/460, 464, 438/68, 114, 458

[56] References Cited

U.S. PATENT DOCUMENTS

| | | | |
|---|---|---|---|
| 3,953,919 | 5/1976 | Moore | 438/464 |
| 5,171,717 | 12/1992 | Broom et al. | 438/460 |
| 5,314,844 | 5/1994 | Imamura | 438/460 |
| 5,393,707 | 2/1995 | Canning | 438/460 |
| 5,418,190 | 5/1995 | Cholewa et al. | 438/464 |
| 5,904,548 | 5/1999 | Orcutt | 438/460 |

*Primary Examiner*—Carl Whitehead, Jr.
*Assistant Examiner*—James Park
*Attorney, Agent, or Firm*—Lester H. Birnbaum

[57] ABSTRACT

The invention disclosed is a method and apparatus for cleaving semiconductor material without physical contact. Tick marks are formed in a major surface of the material where cleaving is desired. A fulcrum member is moved with respect to the material until a tick mark is in alignment with the fulcrum member. A gas jet, also aligned with the fulcrum member, is applied to the surface of the material to form the cleave.

5 Claims, 2 Drawing Sheets

METHOD AND APPARATUS FOR CLEAVING SEMICONDUCTOR MATERIAL

FIELD OF THE INVENTION

This invention relates to semiconductor devices, and in particular to a method and apparatus for cleaving semiconductor material to form devices.

BACKGROUND OF THE INVENTION

Semiconductor devices, for example optical devices such as lasers and photodetectors, are typically formed in a two dimensional array in a semiconductor wafer which is then cleaved to form bars or rows and then individual devices. Typically, scribed tick marks are formed in the semiconductor material where separation is desired, and the material is cleaved at the tick marks by rolling the material manually over a dowel or by striking the bottom surface with an anvil.

While usually adequate, such procedures can yield inconsistent cleave surfaces and/or result in damage to the surfaces of the devices. Lasers in particular usually require uniform cleaved surfaces to ensure good optical output.

SUMMARY OF THE INVENTION

In accordance with one aspect, the invention is a method for cleaving semiconductor material. Tick marks are formed in a major surface of the semiconductor material at portions where cleaving is desired. The material is mounted on a surface of a flexible film. The material is positioned so that a tick mark is vertically aligned with a fulcrum member which is in close proximity to the opposite surface of the film. A gas jet is applied to the surface of the semiconductor which includes the tick mark so that the pressure from the jet forms a cleave at the tick mark.

In accordance with another aspect, the invention is an apparatus for cleaving semiconductor material. The apparatus includes a fulcrum member, a fixture for holding a semiconductor material so that one surface of the material is in close proximity to the fulcrum member, and means for applying a gas jet to an opposite major surface of the semiconductor. The apparatus may further includes means for moving the semiconductor material relative to the gas jet and fulcrum member to align portions of the material with the fulcrum member.

BRIEF DESCRIPTION OF THE FIGURES

These and other features of the invention are delineated in detail in the following description. In the drawing.

DETAILED DESCRIPTION

Figure 1:
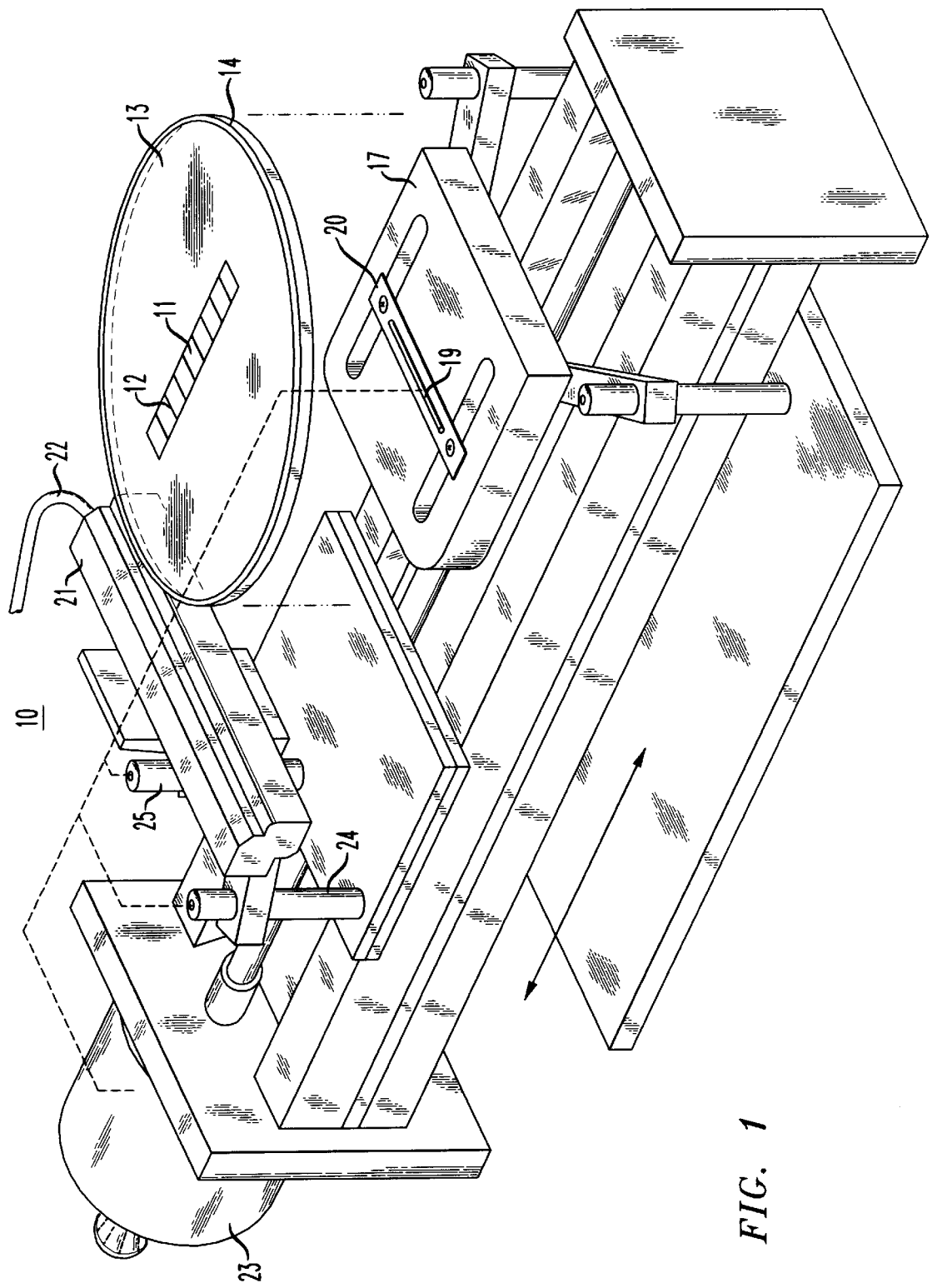
FIG. 1 is perspective view of an apparatus in accordance with an embodiment of the invention.

FIG. 1 illustrates one example of an apparatus, 10, which may be used to cleave a semiconductor material, 11. For the purpose of illustration, only a single bar of semiconductor material, 11, is shown. It will be appreciated that several bars can be mounted in the apparatus for cleaving, and further, the apparatus can be used for cleaving other shapes, such as entire wafers.

In accordance with standard practice, the material, 11, includes several tick marks, e.g., 12, which are scribed in accordance with standard techniques onto one major surface of the semiconductor. These marks indicate the portions which are to cleaved, i.e., the boundaries of the individual devices which are formed in the bar. The bar is mounted on a flexible film, 13, which can be, for example, polyvinyl chloride, and the film, 13, is stretched over a rim, 14. The bar is kept in position due to adhesion to the film. (For more details regarding the use of flexible film to position a material for cleaving, see U.S. patent application of Freund et al, Ser. No. 08/970982, filed Nov. 13, 1997, and incorporated by reference herein.) In accordance with a preferred embodiment, the semiconductor is sandwiched between two sheets of a material, such as Mylar, which is stiffer than the film, 13. The top sheet, 15 of FIG. 2, keeps the bar, 11, on the film, 13, during the process to be described, and the bottom sheet, 16, which contacts the bottom of the flexible film, 13, is useful for reducing sticking to the cleaving fixture. (Sheets 15 and 16 are omitted from FIG. 1 for the sake of clarity in the illustration)

The assembly including the semiconductor, 11, the film, 13, and rim, 14, is mounted on a fixture, 17 (For purposes of illustration, the assembly is shown raised from the fixture 17). A vacuum tube, (not shown), can be placed beneath the fixture, 17, in order to apply a vacuum to hold the rim, 14, on the fixture, 17. A fulcrum member, comprising a rod, 19, mounted on a plate, 20, is slidably mounted on the fixture, 17. A standard stepping motor, 23, is mechanically coupled to the fulcrum in order to provide linear movement of the fulcrum member, 19,20 with respect to the semiconductor material, 11. A standard air knife, 21, supplied by a gas tube, 22, is mounted in vertical alignment with the rod, 19, and mechanically coupled to the fulcrum member by means of rods, e.g., 24 and 25, so that the air knife will move in alignment with the rod, 19. It will be appreciated that, while this embodiment illustrates movement of the fulcrum member and air knife, the invention also contemplates movement of the semiconductor while keeping the air knife and fulcrum member stationary.

Figure 2:
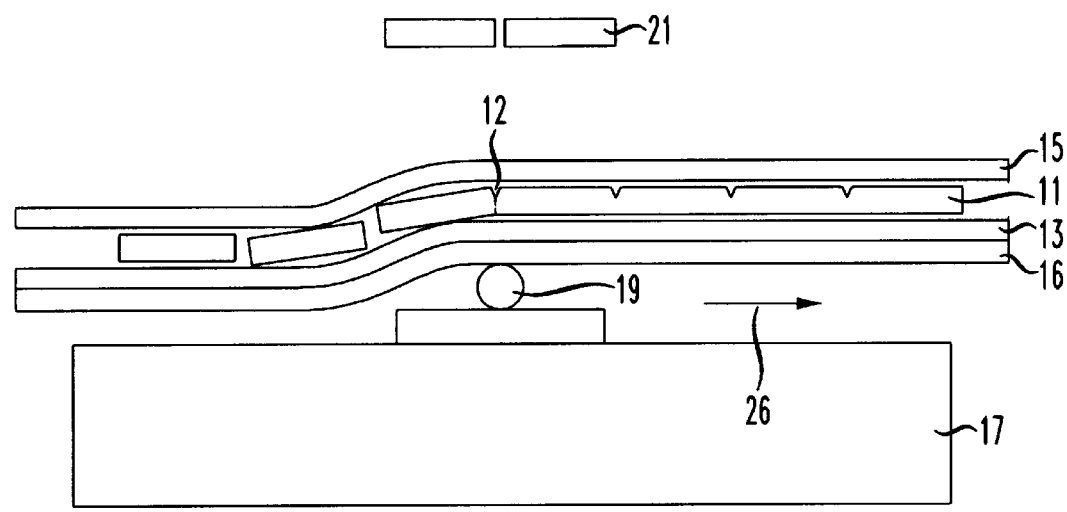
FIGS. 2 and 3 are side schematic views of the apparatus illustrating a method aspect of the invention.
Figure 3:
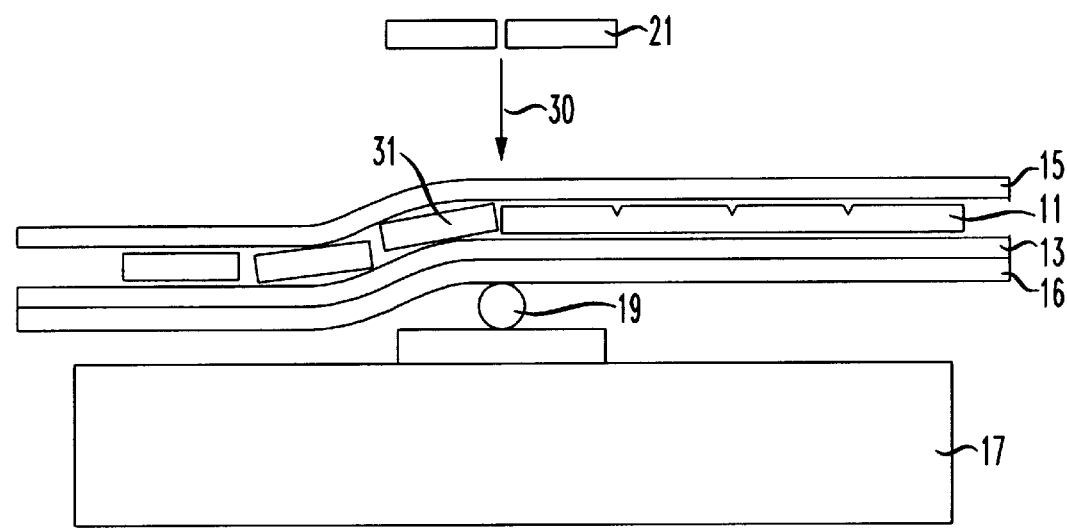

The operation of the apparatus of FIG. 1 is illustrated by the sequence of steps shown in FIGS. 2 and 3. As illustrated in FIG. 2, the fulcrum member, 19,20, is moved by the motor, 23, in the direction of the arrow, 26, until the tick mark, 12, is aligned with the rod, 19. It will be noted that the rod, 19, contacts the sheet, 16, which, in turn, contacts the surface of the film, 13, which is opposite to the surface on which the bar is mounted, and further, that the tick marks, e.g., 12, are on the major surface of the bar which is opposite to the film, 13, i.e., the upper surface in the figures. The surface of the bar including the tick marks faces the air knife, 21, and is protected by the Mylar sheet, 15.

As illustrated in FIG. 3, once the tick mark, 12, is aligned with the rod, 19, a gas jet, illustrated by the arrow 30, is directed at the surface of the bar, 11, which includes the tick marks. Typically, the gas is air or nitrogen, and the pressure is regulated to achieve cleaving . Typically the pressure is within the range 50to 70psi . As illustrated, the pressure from the jet causes the bar to cleave at the tick mark, 12, to form the individual device, 31. The motor then further moves the fulcrum member so that the process can be repeated for each of the tick marks to separate all the devices in the bar.

Thus, it will be appreciated that, since no physical contact is made with the semiconductor, the cleave is made with no significant damage to the semiconductor surface. The process and apparatus further result in uniform sidewalls on the cleaved surfaces, which is desirable for laser devices. In addition, minimal particulates from the cleaved surfaces were observed. Further, although only a single bar of semiconductor material is shown, several bars which are approximately parallel can be mounted on the film 13, and cleaved by the air knife and fulcrum combination essentially simultaneously. Such bars need not be aligned since each bar will be cleaved at the appropriate tick mark independently as they pass over the rod, 19.

What is claimed is:

1. A method for cleaving semiconductor material having opposite major surfaces comprising the steps of:

forming tick marks in one major surface of the material where cleaving is desired;

mounting the material on a surface of a flexible film;

positioning the material so that one of the tick marks is vertically aligned with a fulcrum member which is in close proximity to the opposite surface of the film; and applying a gas jet to the one surface including the tick marks so that pressure from the jet forms a cleave at the tick mark.

2. The method according to claim 1 wherein the gas comprises air or nitrogen.

3. The method according to claim 1 wherein the pressure of the jet is within the range 50 to 70 psi.

4. The method according to claim 1 wherein the material comprises a bar of laser devices so that cleaving the material forms individual devices with side walls at the cleaved surfaces.

5. The method according to claim 1 wherein the flexible film comprises polyvinyl chloride and the sheets comprise Mylar.

* * * * *